United States Patent
Fischer et al.

(10) Patent No.: US 9,726,727 B2
(45) Date of Patent: Aug. 8, 2017

(54) METHOD FOR TESTING A LATCHING MAGNET OF A SWITCH AND TEST DEVICE FOR THE LATCHING MAGNET

(71) Applicant: Siemens Aktiengesellschaft, Munich (DE)

(72) Inventors: Andreas Fischer, Amberg (DE); Stefan Widmann, Freudenberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 80 days.

(21) Appl. No.: 14/612,333

(22) Filed: Feb. 3, 2015

(65) Prior Publication Data

US 2015/0285865 A1 Oct. 8, 2015

(30) Foreign Application Priority Data

Apr. 3, 2014 (DE) ........................ 10 2014 206 360

(51) Int. Cl.
*G01R 31/333* (2006.01)
*H01H 47/00* (2006.01)
*H01H 50/32* (2006.01)
*H01H 51/01* (2006.01)

(52) U.S. Cl.
CPC ......... *G01R 31/333* (2013.01); *H01H 47/002* (2013.01); *H01H 50/32* (2013.01); *H01H 51/01* (2013.01)

(58) Field of Classification Search
CPC ............................ G01R 31/327; G01R 31/333
USPC ..................... 324/424; 361/42, 45
See application file for complete search history.

(56) References Cited

U.S. PATENT DOCUMENTS

| 4,410,814 A | * | 10/1983 | Duijkers |
| 4,746,869 A | | 5/1988 | Schrag et al. |
| 2007/0223172 A1 | * | 9/2007 | Gauxmann |
| 2013/0250634 A1 | * | 9/2013 | Fornage |

FOREIGN PATENT DOCUMENTS

DE 19954037 A1 5/2001

OTHER PUBLICATIONS

German Office Action mailed Nov. 4, 2014 for corresponding DE Application No. 102014206360.4.

* cited by examiner

*Primary Examiner* — Walter L Lindsay, Jr.
*Assistant Examiner* — Milton Gonzalez
(74) *Attorney, Agent, or Firm* — Harness, Dickey & Pierce, P.L.C.

(57) ABSTRACT

A method is disclosed for testing a latching magnet of a switch including a switching contact, formed from contact elements mechanically separated from one another for opening the switching contact; an electronic trip unit, to monitor current flowing via the contact elements and to perform a test for a current-dependent trip condition; an electrical energy store, forming a circuit with the winding of the latching magnet, the circuit being closed for a first closing time when the trip condition of the trip unit is met; and an actuator, actuable by closing off the circuit and configured to separate the contact elements. For test purposes, the circuit is closed for a second closing time, which is so short that separation of the contact elements by the actuator does not take place. A test is then performed to ascertain whether there is a current flowing via the winding of the latching magnet.

6 Claims, 1 Drawing Sheet

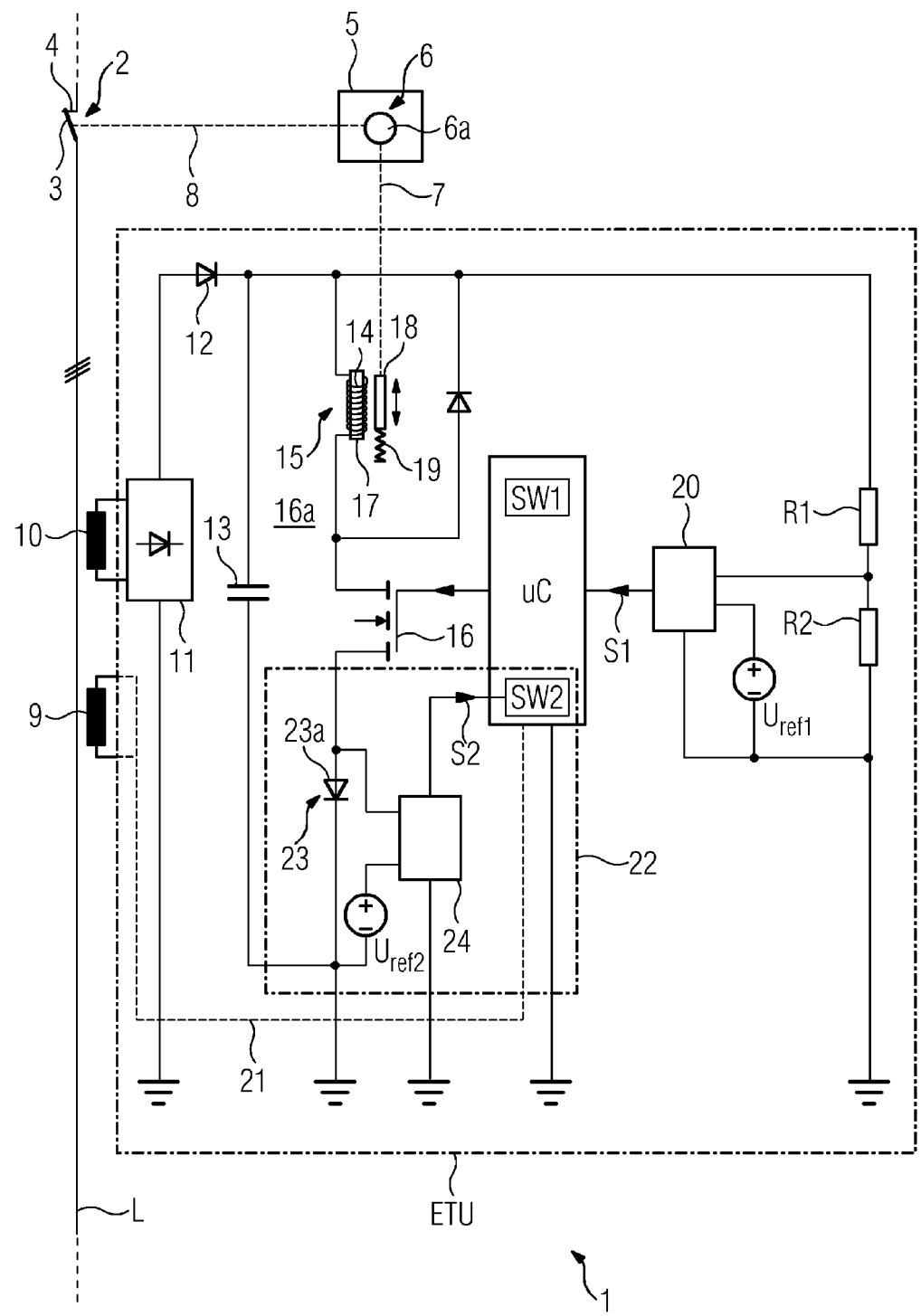

METHOD FOR TESTING A LATCHING MAGNET OF A SWITCH AND TEST DEVICE FOR THE LATCHING MAGNET

PRIORITY STATEMENT

The present application hereby claims priority under 35 U.S.C. §119 to German patent application number DE 102014206360.4 filed Apr. 3, 2014, the entire contents of which are hereby incorporated herein by reference.

FIELD

At least one embodiment of the invention generally relates to a method for testing a latching magnet of a switch and/or to a test device for the latching magnet.

BACKGROUND

Switches in the low-voltage range comprising electromechanical releases are known, for example, as power circuit breakers. The power circuit breakers interrupt the current flowing, for example, when a preset current value, which is detected by an electronic trip unit, is exceeded. The release furthermore comprises a latching magnet (Maglatch), which has a permanent magnet, a winding and a ferromagnetic plunger, wherein the plunger is attracted, counter to the force of a spring, by the magnetic field of the permanent magnet. The tripping takes place by virtue of an opposing magnetic field being generated by the winding arranged on the permanent magnet, which opposing magnetic field compensates for the magnetic field of the permanent magnet in the region of the plunger, such that the plunger is shifted by the spring in the direction of its longitudinal axis in order to actuate the switch. The plunger in this case interacts with an actuator in the form of a switching mechanism, in which a switching shaft is held under mechanical prestress, which switching shaft unlatches the plunger. The switching shaft rotating about its longitudinal axis separates the contact elements and thus opens the switch.

The winding of the latching magnet forms, with an electrical energy store in the form of a capacitor, a circuit which is closed (and opened again) when the tripping condition of the trip unit is met. In general, the capacitor is only partially discharged.

In order to test the latching magnet, i.e. in particular the winding for wire breakage, it is known to pass a test current through the winding which is too low to release the plunger. The test current is monitored, wherein an interruption in the current in particular indicates a wire breakage.

SUMMARY

An embodiment is directed to a solution for testing the latching magnet.

An embodiment discloses a method and an embodiment discloses a test device.

An embodiment, based on the method, provides that the circuit is closed for a second closing time for test purposes, which closing time is so short that no separation of the contact elements by the actuator takes place, and that a test is performed during the closure to ascertain whether a current is flowing via the winding of the latching magnet. This solution makes use of the fact that the current for actuating the actuator needs to flow with a certain (preset) intensity for a certain (preset) time.

Based on an embodiment of the test device, the test device a) closes the circuit for test purposes for a closing time, which is so short that no separation of the contact elements by the actuator takes place, and b) tests in each case, during the closing time, whether there is a current flowing via the winding of the latching magnet.

BRIEF DESCRIPTION OF THE DRAWINGS

The invention will be described in more detail below with reference to an example embodiment.

The only FIGURE shows a switch 1, which is in the form of a power circuit breaker for low voltages.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the FIGURES.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the FIGURE. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGURES. For example, two FIGURES shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the FIGURES. It will be understood that the spatially relative terms are intended to encompass different orientations of the device in use or operation in addition to the orientation depicted in the FIGURES. For example, if the device in the FIGURES is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

An embodiment, based on the method, provides that the circuit is closed for a second closing time for test purposes, which closing time is so short that no separation of the contact elements by the actuator takes place, and that a test is performed during the closure to ascertain whether a current is flowing via the winding of the latching magnet.

This solution makes use of the fact that the current for actuating the actuator needs to flow with a certain (preset) intensity for a certain (preset) time.

In one configuration, the flow of the current is detected by a technically simple current sensor.

In the simplest case, the current sensor is a diode through which the corresponding current flows, wherein it is detected in each case whether there is a corresponding voltage drop across the diode.

Correspondingly, the presence of the (existence of a) voltage drop is detected by way of a comparator.

In a simple manner, the comparator outputs a signal when there is a voltage drop present across the diode.

Based on an embodiment of the test device, the test device a) closes the circuit for test purposes for a closing time, which is so short that no separation of the contact elements by the actuator takes place, and b) tests in each case, during the closing time, whether there is a current flowing via the winding of the latching magnet.

It is technically simple if a current sensor detects the current flow.

The detection may be independent of current when the current sensor has a diode for detecting the current flow and the test device detects the voltage drop across the diode.

Expediently, the test device has a comparator for detecting the voltage drop.

In the simplest case, the comparator outputs a signal when there is a corresponding voltage drop.

The only FIGURE shows a switch 1, which is in the form of a power circuit breaker for low voltages. The switch 1 has a switching contact 2 comprising contact elements 3, 4, which rest against one another when the switching contact 2 is closed, as illustrated schematically in the FIGURE. The switching contact 2 is connected into a line L. In order to interrupt the current flowing through the line L, the switching contact 2 is opened by virtue of the contact elements 3, 4 being separated from one another.

The switch 1 furthermore comprises an electronic trip unit ETU, which in each case monitors the current via the switching contact 2 and in the process performs a test to ascertain whether a preset current-dependent trip condition is met. The trip condition is in this case, by way of example, the fact of a preset current threshold value being exceeded.

In order to detect the current flowing through the conductor L, the current-proportional voltage signal of a sensor coil 9, which is arranged in the magnetic field and therefore in the region of the conductor L, is used.

The trip unit ETU interacts with an actuator 5, which comprises a switching mechanism 6 comprising a switching shaft 6a, which is held under mechanical prestress and opens the switching contact 2 after tripping of the actuator 5. The interaction between the trip unit ETU and the actuator 5 and between the actuator 5 and the switching contact is illustrated schematically via the dashed connecting lines 7, 8 in the figure.

A winding 10, which is wound around the conductor L, couples electrical energy out of the conductor L in the manner of a transformer and outputs this electrical energy to a rectifier unit 11, is used for supplying energy to the trip unit ETU. The rectifier voltage of the rectifier unit 11 charges an energy store in the form of a capacitor 13 via a diode 12.

A winding 14 of a latching magnet 15 which is in series with a transistor switch 16 is connected in parallel with the capacitor 13. The latching magnet 15 comprises a permanent magnet 17, around which the winding 14 is wound. A plunger 18 is attracted magnetically, counter to the force of a spring 19, via the permanent magnet 17 and retained in the process.

When the transistor switch 16 is closed, the capacitor 13 and the latching magnet 15 (i.e. the winding 14 thereof) form a closed circuit 16a, wherein the capacitor 13 is in the discharge mode, in which its discharge current flows through the winding 14 and an opposing magnetic field builds up. This opposing magnetic field weakens the magnetic field of the permanent magnet 17 such that the magnetic attraction force thereof is no longer sufficient for retaining the plunger 18. The plunger 18 thus released moves towards the switching mechanism 6 and unlatches the switching mechanism 6. The rotation of the switching shaft 6a about its longitudinal axis triggered thereby opens the switching contact 2.

The closing of the transistor switch 16 and therefore of the circuit 16a for a (first) closing time takes place by means of a microcontroller µC belonging to the trip unit ETU when the trip condition is met, wherein the test in respect of the trip condition is performed by (first) software (software program) SW1, to be precise on the basis of the voltage signal output by the sensor coil 9 (illustrated schematically as a dashed line 21). The closing time in which the capacitor is partially discharged is in this case 4 ms. Then, the transistor switch 16 is opened again.

A (first) comparator 20 monitors the voltage of the capacitor 13 and compares this with a (first) reference voltage Uref1, wherein the voltage of the capacitor 13 is matched to the reference voltage Uref1 via a voltage divider comprising the resistors R1, R2, which reference voltage Uref1 forms a preset reference value. The comparator 20 signals (signal S1) to the microcontroller µC in each case whether the voltage of the capacitor 13 is greater than or equal to the reference voltage Uref1, and the capacitor 13 is therefore charged. Tripping only takes place when the capacitor 13 is charged.

A test device 22 provided for testing the latching magnet 15, i.e. in particular the winding 14 thereof for wire breakage, comprises (second) software (software program) SW2 running on the microcontroller µC, a current sensor 23 switched into the circuit 16a and a further (second) comparator 24. The software SW2 closes the transistor switch 16 for a short (preset) time period, a (second) closing time, and therefore switches the capacitor 13 into the discharge mode for a short period of time, wherein the length of the time period is selected to be so short that no actuation of the actuator 5 takes place. During this short time period, a test is performed to ascertain whether there is a corresponding current flowing via the latching magnet 15. In this case, use is made of the fact that the current for actuating the actuator needs to flow with a certain (preset) intensity for a certain (preset) time. If, therefore, a current is flowing with a sufficient intensity but for too short a time, no release of the plunger 18 takes place, which is necessary in the test. The closing time (the test pulse at the transistor switch 16) in this case has a time length of less than 0.1 ms.

The current flow in the circuit 16a closed for a short period of time is checked by means of the current sensor 23 in the form of a diode 23a, wherein in each case the voltage drop across the diode 23a is compared with a (second) reference voltage Uref2 by means of the comparator 24. The comparator 24 in each case outputs a signal S2 when there is no corresponding voltage drop when the transistor switch 16 is closed. The signal S2 therefore indicates that there is a fault, in particular in the form of a wire breakage of the winding 14. This fault is output (signaled) by the microcontroller µC in the form of a fault signal.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for testing an electromagnetic latching magnet of a switch including a switching contact, formed from contact elements mechanically separated from one another to open the switching contact, the latching magnet including a permanent magnet, around which a winding is wound, the winding being tested for wire breakage, an electronic trip unit to monitor current flowing via the contact elements and to perform a test that a current-dependent trip condition is met, an electrical energy store, in the form of a capacitor, forming a circuit with the winding of the latching magnet, the circuit being closed for a first closing time when the trip condition of the trip unit is met, and an actuator, actuable by closing off the circuit and configured to separate the contact elements, the method comprising:

closing the circuit for a second closing time for test purposes by closing a transistor switch, the second closing time being so short that no separation of the contact elements by the actuator takes place, wherein when the transistor switch is closed, the capacitor, the winding of the latching magnet and a current sensor form a closed circuit and the capacitor is in a discharge mode; and performing a test during the second closing time to ascertain whether a current is flowing via the winding of the latching magnet, wherein the flow of the corresponding current is detected by the current sensor, and wherein the current sensor is a diode, through which the corresponding current is arranged to flow, the method further comprising detecting whether there is a corresponding voltage drop across the diode.

2. The method of claim 1, wherein a presence of the voltage drop is detected by use of a comparator.

3. The method of claim 2, further comprising:
   outputting, via the comparator, a signal when there is no corresponding voltage drop.

4. A test device for a latching magnet of a switch, the switch including a switching contact, formed from contact elements separated mechanically from one another when the switching contact is open and resting against one another when the switching contact is closed, an electronic trip unit to monitor current flowing via the contact elements and to perform a test to ascertain whether a current-dependent trip condition is met, a capacitor as an electrical energy store, forming, with a winding of a latching magnet, a circuit which is closed by the trip unit when the trip condition is met, wherein the latching magnet includes a permanent magnet, around which a winding is wound, the winding being tested for wire breakage, and an actuator, whose actuation is configured to be performed by closing of the circuit for a first closing time, and configured to separate the contact elements after the actuation, the test device comprising:
- a current sensor to detect the current flow, the current sensor including a diode for detecting the current flow, wherein the test device is configured to close the circuit for test purposes for a second closing time by closing a transistor switch, the second closing time being so short that no separation of the contact elements by the actuator takes place, the capacitor, the winding of the latching magnet and the current sensor form a closed circuit when the transistor switch is closed, the capacitor being in a discharge mode, and to test, during the second closing time, whether there is a current flowing via the winding of the latching magnet by detecting a voltage drop across the diode.

5. The test device of claim 4, further comprising:
a comparator, to detect the voltage drop.

6. The test device of claim 5, wherein the comparator is configured to output a signal when there is no corresponding voltage drop.

\* \* \* \* \*